United States Patent [19]

Kawagoe et al.

[11] Patent Number: 5,282,099
[45] Date of Patent: Jan. 25, 1994

[54] DISK DRIVE APPARATUS INCORPORATING CIRCUITRY INTO HOUSING

[75] Inventors: Seiji Kawagoe; Katsuhiko Kaida, both of Tokyo, Japan

[73] Assignee: Kabushiki Kaisha Toshiba, Kawasaki, Japan

[21] Appl. No.: 753,054

[22] Filed: Aug. 30, 1991

[30] Foreign Application Priority Data

Aug. 31, 1990 [JP] Japan .................................. 2-229619

[51] Int. Cl.⁵ ............................................ G11B 33/12
[52] U.S. Cl. ................................ 360/97.01; 360/97.02; 360/900
[58] Field of Search .................. 360/97.01, 97.02, 105, 360/DIG. 900

[56] References Cited

U.S. PATENT DOCUMENTS

| | | | |
|---|---|---|---|
| 4,855,849 | 8/1989 | Jones et al. | 360/97.01 |
| 4,930,029 | 5/1990 | Morita | 360/97.01 |
| 4,979,062 | 12/1990 | Stefansky et al. | 360/97.02 |
| 5,025,336 | 6/1991 | Morehouse et al. | 360/97.02 |
| 5,034,837 | 7/1991 | Schmitz | 360/105 |

Primary Examiner—John H. Wolff
Attorney, Agent, or Firm—Cushman, Darby & Cushman

[57] ABSTRACT

A hard disk drive includes a housing formed of a conductive material, and mechanical components housed in the housing. An electronic circuit for driving and controlling the mechanical components is housed in the housing. The drive circuit section has an insulating layer coated on the inner surface of the housing, a printed circuit formed on the insulating layer and having a desired pattern, and electronic parts mounted on the printed circuit. The drive circuit section uses the walls of the housing as a support base.

11 Claims, 3 Drawing Sheets

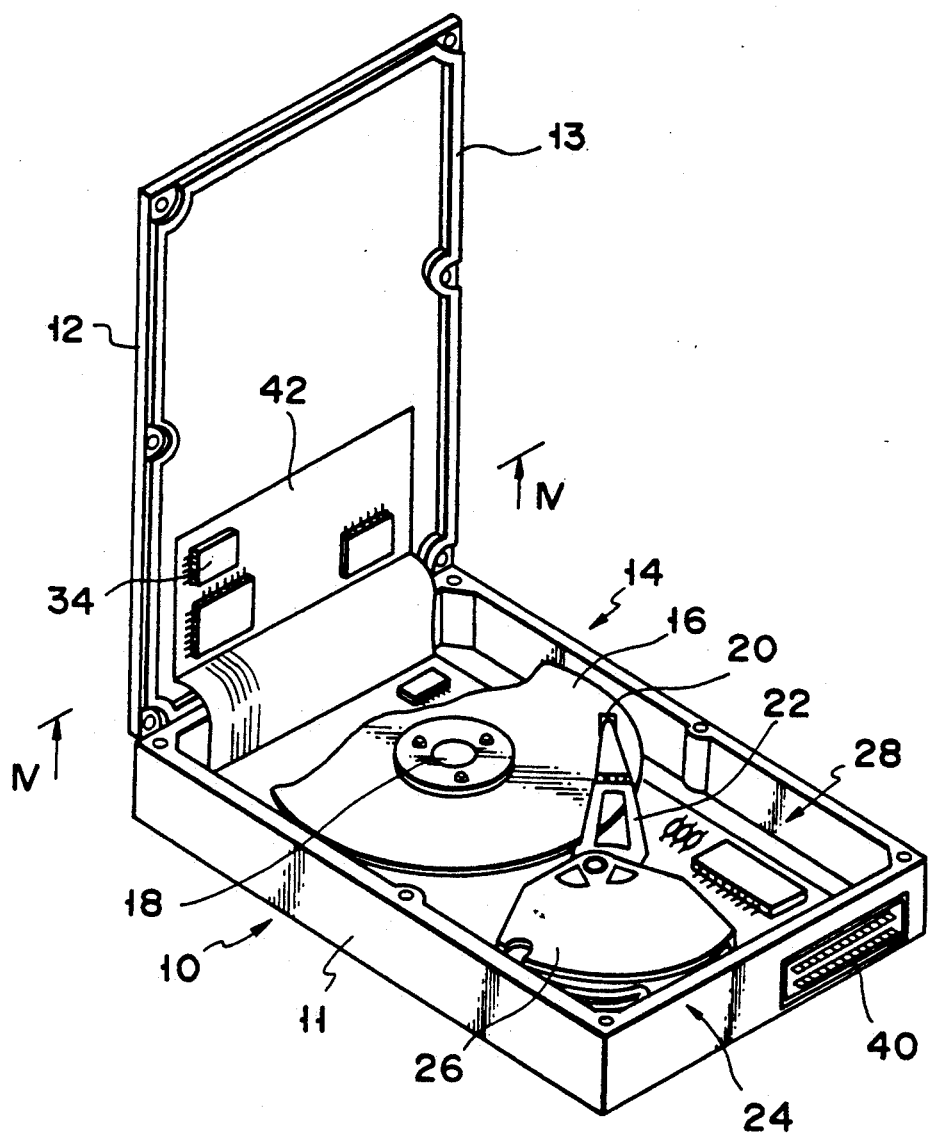
F I G. 3
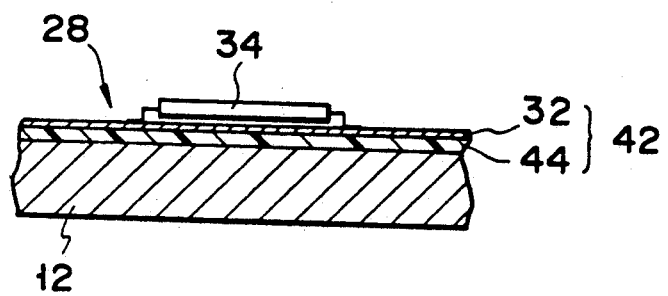
F I G. 4

DISK DRIVE APPARATUS INCORPORATING CIRCUITRY INTO HOUSING

BACKGROUND OF THE INVENTION

1. Field of the Invention

The present invention relates to a disk drive apparatus such as a hard disk drive, and the like.

2. Description of the Related Art

Disk drive apparatuses such as floppy disk drives and hard disk drives are used as external memory devices for use with electronic devices such as word processors and personal computers.

Generally, the disk drive apparatus of this kind includes a structural frame and a drive mechanism enclosed in the structural frame. The structural frame will also be referred to within as the housing or the closed housing. The mechanism include a magnetic disk, a spindle motor for rotating the magnetic disk, a carriage for supporting magnetic heads, a voice coil motor for driving the carriage to move the magnetic heads to a desired information track on the disk, and the like. The housing is formed of conductive material such as metal and conductive plastics to electromagnetically shield the mechanisms therein.

Further, the disk drive apparatus has a printed circuit board located outside the housing, particularly, fixed to the underside of the housing. This circuit board includes circuits for driving spindle and voice coil motors and controlling the read/write of the magnetic heads.

As electronic devices such as word processors and personal computers have been made smaller and smaller in size these days, it is asked that the disk drive apparatus is made smaller in size and thickness. When the circuit board is arranged outside the housing, occupying its own space, as in the conventional apparatuses, however, it prevents the disk drive device from being made smaller in size and thickness.

SUMMARY OF THE INVENTION

The present invention is contrived in consideration of the above circumstances, and intended to provide a disk drive apparatus capable of being made smaller in size and thickness.

In order to achieve the above object, according to the present invention, the circuit means for driving and controlling mechanisms arranged in the housing is contained in the housing. Specifically, the circuit means section includes a circuit formed on an inner surface of the housing and electronic parts mounted on the circuit, and it uses the housing itself as its substrate.

With the apparatus having the above construction, it is not necessary to provide a space for installing the circuit means section at the outside of the housing, thereby enabling the apparatus to be made smaller in size and thickness.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1 and 2 show a hard disk drive according to a first embodiment of the present invention, in which:

FIG. 1 is a perspective view showing the drive while opening a cover of its housing;

FIG. 2 is an enlarged sectional view taken along a line II—II in FIG. 1;

FIGS. 3 and 4 show a hard disk drive according to a second embodiment of the present invention, in which:

FIG. 3 is a perspective view showing the drive while opening a cover of its housing;

FIG. 4 is an enlarged sectional view taken along a line IV—IV in FIG. 3;

DETAILED DESCRIPTION OF THE PREFERRED EMBODIMENTS

Figure 1:
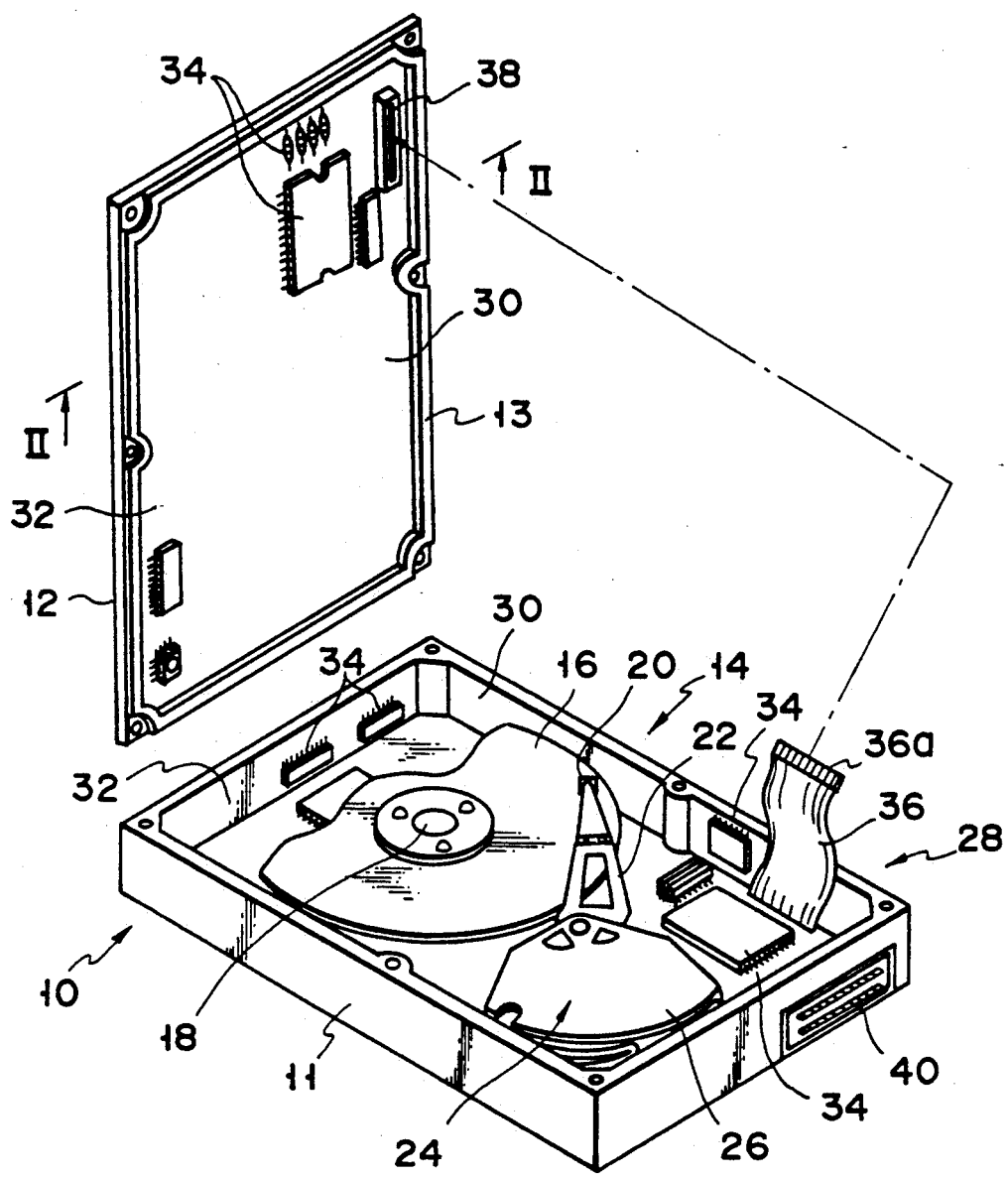

FIG. 1 shows an example in which the present invention is applied to a hard disk drive (which will be hereinafter referred to as the HDD).

The HDD comprises a closed housing 10 and a drive mechanism 14 serving as operation means and contained in the housing 10. The housing 10 includes a rectangular body 11 whose top is opened, and a rectangular cover 12 for closing the opened top of the body 11. The housing 10 is metal-cast or -processed to electromagnetically shield the mechanism 14 in the housing 10. The cover 12 is screwed to the upper edge of the body 11 by screws (not shown) and a seal member 13 which contacts with the upper edge of the body 11 is fixed to the inner face of the cover 12.

The mechanism 14 serving as operation means includes a spindle motor 18 and a carriage 22 which are mounted on the bottom of the housing 10. A magnetic disk 16 is mounted on the rotary shaft of the motor 18 and rotated by the motor 18. A pair of magnetic heads 20 (only one of them is shown in FIG. 1) for recording and reproducing information on and from the disk 16 are supported on tip ends of the carriage 22 and movable on the surfaces of the disk 16. Further, the mechanism 14 includes a voice coil motor 24 for rotating the carriage 22. The motor 24 comprises a coil (not shown) attached to the carriage 22, a yoke 26 mounted on the bottom of the housing 10, and a magnet (not shown) fixed to the yoke 26. When the carriage 22 is rotated by the motor 24, the heads 20 are moved to desired information tracks on the disk 16.

An electronic circuit 28 for driving and controlling the mechanism 14 is housed in the housing 10.

Figure 2:
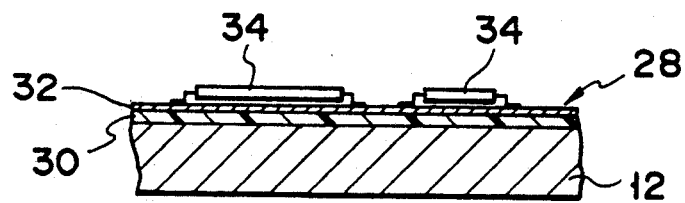

More specifically, insulating layers 30 formed of nonconductive plastics are coated on the inner surface of the body 11, that is, the bottom surface and inner side surfaces of the body 11, and the inner face of the cover 12, as shown in FIGS. 1 and 2. Printed circuits 32 each having a desired pattern and being made according to the manner of making printed-wiring boards are formed on the insulating layers 30. A plurality of electronic parts 34 are mounted surface mount) on the surfaces of the circuits 32. These electronic parts 34 are located so as not to prevent the rotation of the disk 16 and the movement of the carriage 22. The electronic parts 34, circuits 32 and insulating layers 30 form the electronic circuit 28 which includes circuits for driving the spindle motor 18, controlling the read/write of the heads 20, and driving the voice coil motor 24.

A flat cable 36 extends upward from that portion of the circuit 32 on the bottom of the housing 10 which is beside the carriage 22. A connector 36a of the card edge type is formed at the distal end of the cable 36. This connector 36a is detachably connected to a connector 38 mounted on the circuit 32 of the cover 12. The circuit 32 located on the body 11 is thus electrically connected to that located on the cover 12. An interface connector 40 is attached to one of the side walls of the housing 10 and exposed outside. The connector 40 is electrically connected to the circuit 32 in the body 11. The HDD is connected to an electronic device such as a personal computer through the interface connector 40. The connector 40 may be exposed outside from the underside of the body 11.

According to the HDD having the above-described arrangement, the electronic circuit 28 for driving and controlling the drive mechanism 14 is housed in the housing 10. This enables the HDD to be made small in size and thickness, as compared with those having their electronic circuit board outside the housing. Further, the electronic circuit 28 uses the walls of the housing as their support base because the insulating layers 30 and the circuits 32 are formed on the inner faces of the housing 10. Thus, the mechanical strength of the electronic circuit 28 can be made sufficiently larger. In addition, no independent support base for the electronic circuit is needed to be arranged in the housing 10, and the electronic parts 34 are disposed at unoccupied spaces in the housing such as under and above the disk 16 and beside the carriage 22. This prevents the housing 10 from being made large in size, so that the advantages of the structure wherein the electronic circuit is housed in the housing can be effectively utilized.

FIGS. 3 and 4 show a HDD according to a second embodiment of the present invention.

According to this embodiment, a flexible printed circuit board 42 is bonded to the inner face of the housing 10, instead of forming the insulating layer and the printed circuit thereon. The circuit board 42 includes an insulating film 44 formed of non-conductive plastics, and printed circuit 32 formed on the film and provided with a desired pattern. The circuit board 42 extends from the inner face of the body 11 to that of the cover 12 while the insulating film 44 is bonded to the inner faces of the housing 10. A plurality of electronic parts 34 are mounted on the surface the printed circuit 32 and arranged in positions which do not interfere with the disk 16 and the carriage 22.

Other components of the second embodiment are same as those of the first one. Therefore, these components will be represented by same reference numerals and description thereof will be omitted accordingly.

The second embodiment having the above-described arrangement can also attain the same advantages as those achieved by the first on and the manufacturing of the HDD can be made easier.

Figure 5:
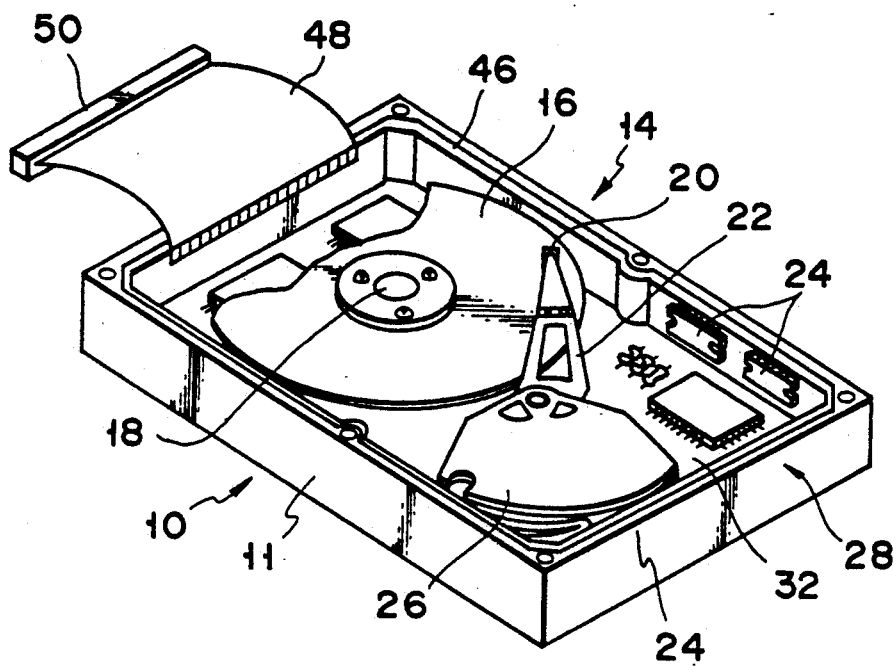
FIG. 5 is a perspective view showing a hard disk drive according to a third embodiment of the present invention while its cover is removed.

FIG. 5 shows a HDD according to a third embodiment of the present invention.

In the third embodiment, an inner housing 46 formed of non-conductive plastics and shaped substantially the same as the body 11 of a housing 10 is fitted in the body 11, while contacting the bottom and inner side surfaces of the body 11. A printed circuit 32 having a desired pattern is formed on inner surfaces of the inner housing 46 and a plurality of electronic parts 34 are mounted on the circuit 32. A flat cable 48 electrically connected to the print circuit 32 extends outside the body 11, and an interface connector 50 which enables the HDD to be connected to an electronic device is attached to the distal end of the cable 48.

Other arrangement of the third embodiment are same as those of the first one. Therefore, the components the same as in the first embodiment will be represented by same reference numerals, and a description thereof will be omitted.

The third embodiment having the above-described arrangement can also attain the same advantages as those attained by the first one.

It should be understood that the present invention is not limited to the above-described embodiments and that various changes and modifications can be made without departing from the spirit and scope of the present invention.

Figure 6:
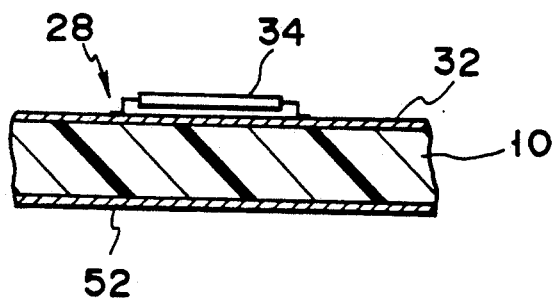
FIG. 6 is a sectional view showing a part of a hard disk drive according to a fourth embodiment of the present invention.

For example, the present invention may be applied to a floppy disk drive as well as the hard disk drive. Further, the material of which the housing is made is not limited to metal, but it may be formed of conductive plastics. In this case, a shield layer 52 is formed on the outer surface of the housing to electromagnetically shield the interior of the housing, and a printed circuit 32 is formed directly on the inner face of the housing, as shown in FIG. 6. Electronic parts 34 are mounted on the circuit 32. With the above arrangement, the HDD can be more smaller-sized.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A disk drive apparatus comprising:
   a structural frame having inner surfaces defining a closed compartment;
   mechanical components housed in the closed compartment and including a disk on which information is recorded, a first motor for rotating the disk, head means for recording and reproducing information on and from the disk, means for supporting the head means to be movable relative to the disk, and a second motor for moving the supporting means; and
   circuit means for driving and controlling the mechanical components, said circuit means including electronic parts located in the closed compartment and mounted on the inner surfaces of the closed compartment, means, unitarily disposed on the inner surfaces of the closed compartment, for interconnecting the electronic parts, and means, disposed in the closed compartment, for connecting the electrical parts to the mechanical components, whereby the need for a circuit board other than the inner surfaces is precluded.

2. An apparatus according to claim 1, wherein said housing is formed of a conductive material, said circuit means includes an insulating layer formed on the inner surface of the housing, and said printed circuit is formed on the insulating layer.

3. An apparatus according to claim 1, wherein said housing is formed of a conductive material, and said circuit means includes a flexible circuit board having an insulating film and a printed circuit formed on the film and being bonded onto the inner surface of the housing while the insulating film is in contact with the inner surface of the housing.

4. An apparatus according to claim 1, wherein said housing is formed of a non-conductive material and includes a shield layer formed on an outer surface of the housing, for shielding the interior of the housing.

5. An apparatus according to claim 1, wherein said structural frame comprises a box-like body having a top opening, a bottom wall, and side walls erected along edges of the bottom wall, and a cover detachably attached to the body to close the top opening, the bottom wall, side walls and cover having inner surfaces defining said closed compartment, and said means for connecting the electronic parts is unitarily disposed on the inner surfaces of the bottom wall and the side walls of the body.

6. An apparatus according to claim 5, wherein said circuit means includes a printed circuit formed on the inner surface of the cover, a first connector fixed to the inner surface of the cover and connected to the printed circuit formed on the cover, and a second connector detachably connected to the first connector, the second connector being arranged in the body and connected to the printed circuit formed on the inner surface of the body.

7. An apparatus according to claim 1, wherein said structural frame includes a box-like body having a top opening, a bottom wall, and side walls erected along edges of the bottom wall, and a cover detachably attached to the body to close the top opening, the bottom wall, side walls and cover having inner surfaces defining said closed compartment, said circuit means includes a flexible circuit board having an insulating film and a printed circuit formed on the insulating film, the flexible circuit board being bonded onto the inner surface of the bottom wall and cover while the insulating film is in contact with the inner surface of the structural frame.

8. An apparatus according to claim 1, wherein said circuit means has an interface connector connected to the printed circuit while being fixed to the housing and exposed to the outside of the housing.

9. An apparatus according to claim 1, wherein said circuit means includes a cable connected to the printed circuit and extending outside the housing, and an interface connector attached to the extended end of the cable.

10. An apparatus according to claim 1, wherein said structural frame includes a box-like body having a top opening, a bottom wall, and side walls erected along edges of the bottom wall, a cover detachably attached to the body to close the top opening, and an inner housing formed of a non-conductive material and shaped substantially the same as the body and fitted in the body while being in contact with an inner surface of the body, the inner housing having an inner surface defining the closed compartment, and said means for connecting the electronic parts is unitarily disposed is formed on the inner surface of the inner housing.

11. A disk drive apparatus comprising:
a structural frame having an inner surfaces defining a closed compartment;
operation means arranged in the closed compartment and having a disk, for recording and reproducing information on and from the disk; and
circuit means for driving and controlling the operation means, said circuit means including electronic parts located on the closed compartment and mounted on the inner surfaces of the closed compartment, means, unitarily disposed on the inner surfaces of the closed compartment, for interconnecting the electronic parts, and means, disposed in the closed compartment, for connecting the electrical parts to the mechanical components, whereby the need for a circuit board other than the inner surfaces is precluded.

* * * * *